Sept. 18, 1962 R. T. ADAMS 3,054,973

CRYSTAL CONTROLLED OSCILLATOR CIRCUIT WITH FREQUENCY CONTROL MEANS

Filed May 26, 1958

Inventor
ROBERT T. ADAMS
By Alfred C. Hill
Agent

1

3,054,973

CRYSTAL CONTROLLED OSCILLATOR CIRCUIT WITH FREQUENCY CONTROL MEANS

Robert T. Adams, Short Hills, N.J., assignor to International Telephone and Telegraph Corporation, Nutley, N.J., a corporation of Maryland Filed May 26, 1958, Ser. No. 737,754
25 Claims. (Cl. 332—27)

Figure 1:
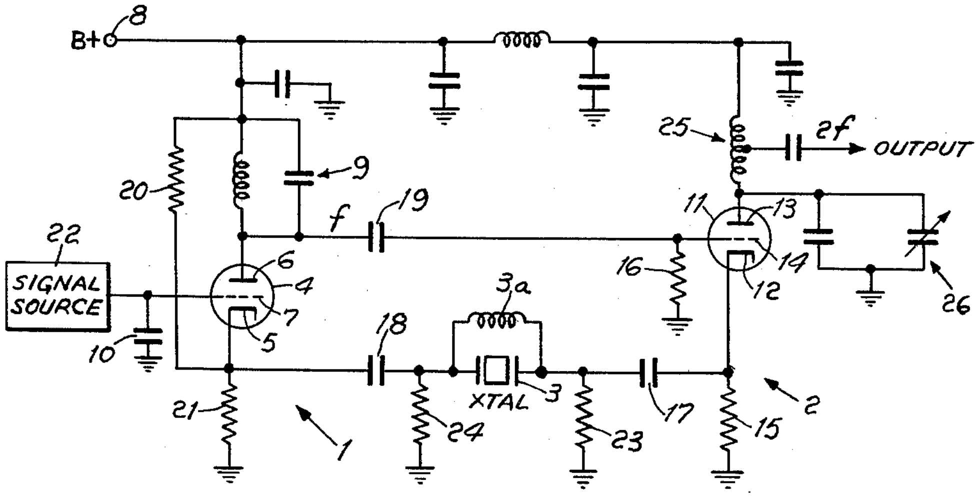

This invention relates to oscillator circuits and more particularly to an oscillator circuit incorporating an improved frequency control arrangement.

Heretofore oscillator circuits have incorporated reactance tubes in shunt relation to the resonant circuit to afford a control of the frequency output of the oscillator. This control of frequency output has been for the purpose of automatic frequency control in the case of the oscillator being employed as a local oscillator in a receiver and for the purpose of frequency modulating the oscillator frequency output for the purpose of communication of intelligence.

While the reactance tube frequency control arrangement of an oscillator is useful, it does have a disadvantage, particularly in the control of the local oscillator frequency. If frequency control is lost by the reactance tube failing, the oscillator will still oscillate. This means that a receiver in which the controlled local oscillator is employed may be operating at the wrong frequency which in most communication systems and particularly over-the-horizon communication systems is undesirable. In the frequency modulation arrangement it may also be undesirable to lose modulation and still have the oscillator operating.

Therefore, an object of this invention is to provide a frequency controlled oscillator circuit overcoming the above-mentioned disadvantage.

Another object of this invention is to provide a frequency controlled oscillator circuit which does not employ a reactance tube circuit for frequency control.

Still another object of this invention is to provide an oscillator circuit incorporating a frequency control element in the oscillatory loop such that if control is lost by failure of the frequency control element, oscillation ceases.

A further object of this invention is to provide a crystal controlled oscillator circuit operating in the crystal series resonant mode incorporating an improved arrangement to control the frequency output of the oscillator circuit.

A feature of this invention is the provision of a frequency controlled oscillator circuit comprising an oscillatory loop including an amplifier and a feedback circuit in coupled relation to the amplifier to sustain oscillations in the oscillatory loop and a frequency control element disposed in the oscillatory loop to control the frequency of the oscillation.

Another feature of this invention is the provision of a Butler-type oscillator wherein frequency control is obtained by biasing the control electrode and electrical energy carrier emitting electrodes of the grounded control electrode amplifier in a manner to substantially prevent control electrode current limiting in the amplifier device and then applying the frequency control signal to the control electrode of the amplifier device.

Still another feature of this invention is the provision of a grounded control electrode amplifier and a cathode follower interconnected by a crystal between the electrical energy carrier emitting electrodes of the grounded control electrode amplifier and the cathode follower to provide the oscillatory circuit path. A bias arrangement is provided on the control electrode of the grounded control electrode amplifier to substantially prevent this amplifier from control electrode current limiting. The frequency control signal, whether it be an automatic frequency control potential or an audio signal to modulate the oscillating signal, is applied to the control electrode of the grounded control electrode amplifier to control the frequency of the oscillations in accordance with the signals coupled thereto.

2

A further feature of this invention is the provision of an inductance in shunt relation with the crystal of the grounded control electrode amplifier-cathode follower oscillator to effectively anti-resonate the shunt capacity of the crystal at the higher frequency end of the range of frequency operation to thereby enable the crystal to operate in the series resonant mode over a greater frequency range. This arrangement will then permit a wider deviation of the oscillator frequency in the case of the frequency modulated oscillator and a greater pull range in case of the automatic frequency control of the oscillator.

The frequency control oscillator circuit hereindescribed may employ electron discharge or transistor amplifier devices as the ground control electrode amplifier and the cathode follower. In the objects and features, the following description and in the claims, the terms "electrical energy carrier emitting electrode," "collecting electrode" and "control electrode" have been employed in a relatively broad sense to encompass the cathode, anode and control grid of the electron discharge device and the emitter, collector and base of a transistor device. The term "electrical energy carrier emitting electrode" refers to the cathode of the electron discharge device which emits electrons as the electrical energy carrier and to the emitter of the transistor device which emits negative charges or carriers of negative charges (holes) as the electrical energy carrier. The term "collecting electrode" refers to the anode of the electron discharge device which collects the electrons emitted from the cathode and the collector of the transistor which collects the negative charges or carriers of negative charges emitted from the emitter. The term "control electrode" refers to the control grid of the electron discharge device which controls the flow of electrons from the cathode to the anode and the base electrode of the transistor device which controls the flow of negative charges or carriers of negative charges from the emitter to the collector.

Figure 2:
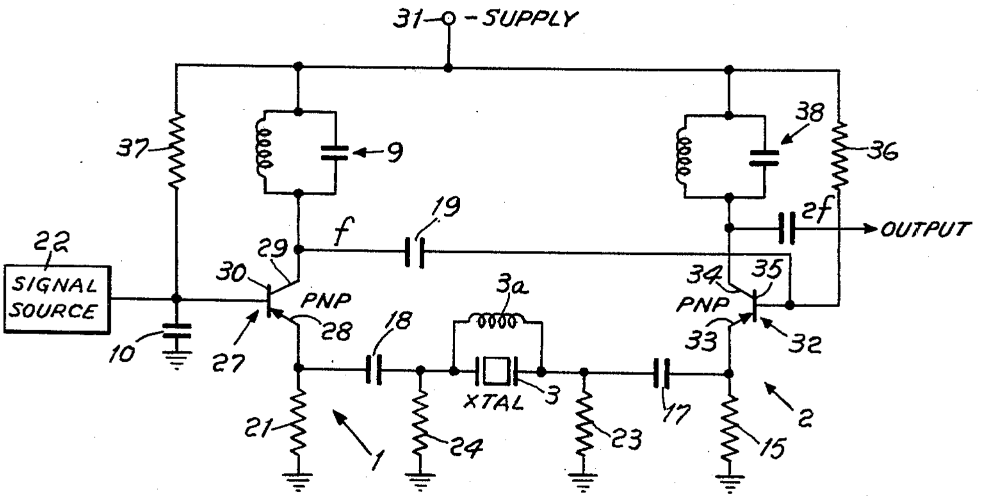

The above-mentioned and other features and objects of this invention and the manner of attaining them will become more apparent by reference to the following description taken in conjunction with the drawing, wherein FIG. 1 illustrates in schematic form an embodiment of my invention employing electron discharge devices; and FIG. 2 illustrates in schematic form an embodiment of my invention employing transistor devices.

Referring to FIG. 1, there is illustrated an oscillator circuit essentially consisting of a modified Butler-type oscillator which basically includes a grounded control electrode amplifier 1 and a cathode follower 2 interconnected as illustrated by a piezoelectric crystal 3. Amplifier 1 includes an electron discharge device 4 having at least a cathode 5 (an electrode for emitting electrical energy carriers), an anode 6 (an electrode for collecting electrical energy carriers) and a control grid 7 (an electrode to control the flow of electrical energy carriers from the emitting electrode to the collecting electrode). The anode circuit coupled to anode 6 includes anode power supply (B+), terminal 8 and tuned circuit 9. Tuned circuit 9 is adjusted to be resonant at the frequency of oscillation as established by the piezoelectric crystal 3. Control grid 7 of electron discharge device 4 is coupled to ground by means of condenser 10 and hence electron discharge device and its associated circuit operates as a grounded grid or control electrode amplifier with respect to the alternating oscillatory currents flowing in the oscillatory loop. Cathode follower 2 includes electron discharge device 11 having a cathode 12 (an electrical energy carrier emitting electrode), an anode 13 (an electrode to collect the electrical energy carriers) and a control grid 14 (an electrode to control the flow of electrical energy carriers between the emitting electrode and the collecting electrode). Cathode 12 is biased by means of resistor 15 and control grid 14 is biased by means of resistor 16 such that grid current may be drawn by grid 14 and hence grid current limiting will take place to control the amplitude of oscillations. The feedback circuit for device 4 is provided by device 11 connected as a cathode follower with respect to the oscillatory energy and crystal 3 coupled between cathode 12 of device 11 and cathode 5 of device 4 by means of condensers 17 and 18. Condenser 19 couples the signal developed in tuned circuit 9 from anode 6 to the control grid 14 of electron discharge device 11 to complete the feedback circuit.

Condenser 17 not only serves to couple the attenuating oscillatory currents to crystal 3, but also serves to block the direct current bias voltage from influencing crystal 3.

Resistors 20 and 21 located in grounded grid amplifier 1 are connected between terminal 8, B+ voltage, and ground potential to establish a predetermined bias on cathode 5 relative to control grid 4 such that the control electrode will not draw appreciable current and thus substantially prevents grid current limiting in electron discharge device 4. Condenser 18 which also serves as an alternating current coupling condenser for the oscillatory current flowing in the oscillator feedback path also blocks the bias voltage on cathode 5 to prevent its influencing crystal 3.

It has been found that by injecting a signal potential on control grid 7 of discharge device 4, that it is possible to control the frequency of oscillation and hence to change the phase of the output signal of the oscillator circuit. By injecting a signal potential on control grid 7, the operating characteristic, such as the plate resistance $R_P$ and transconductance *gm*, of electron discharge device 4 are changed in a manner to change the phase of the signal passing through device 4 which will then produce a compensating change in the phase of the signal passing through the crystal thereby producing a frequency change in the output of the crystal and hence the entire oscillatory circuit. It has been determined that frequency sensitivity in the order of 0.001 percent per volt is obtained with the frequency control arrangement herein described.

It should be pointed out that the signals from source 22 may be direct current signals as would be the case in automatic frequency or phase control of the local oscillator. These direct current signals would have the proper amplitude and polarity to adjust the frequency of the oscillations to meet requirements dictated by succeeding portions of a communication receiver. Signal source 22 may also be a voice signal or other intelligence signal which will act to frequency modulate the oscillations that take place in the oscillator circuit.

The operation of the oscillator is as follows. Assume an output from cathode 12 of the cathode follower 2 at the crystal frequency *f*. This output passes through the frequency determining crystal 7 to the cathode 5 of grounded grid amplifier 1. The output of electron discharge device 4 appears across the parallel tuned circuit 9. This output is coupled back to grid 14 of cathode follower 2, the output of which appears again at cathode 12. The phase relationship in the feedback circuit including electron discharge device 4, grid 14 and cathode 12 of electron discharge device 11 and crystal 3 is of such a nature as to sustain oscillations, that is, has a phase shift about the loop equal to zero degrees. Also the gain about the loop is approximately equal to one to meet all the requirements necessary to provide sustained signal oscillations. When this circuit was originally developed, it was discovered that the gain about the loop was higher than desired and further that since crystal 3 is operated in the series resonant mode, that the impedance in the crystal portion of the feedback circuit needed better matching. Therefore, resistors 23 and 24 were incorporated in the circuit to provide the necessary low impedance for crystal 3 which better matches or terminates the crystal to provide a better frequency control of the crystal frequency. Resistors 23 and 24 also reduce the loop gain, that is, reduce the strength of the oscillatory currents that occurred in the original circuit, so as to minimize undesirable overload effects (instability and operation in undesired crystal modes) and avoid excessive grid-current in the frequency-controlling circuit.

As mentioned hereinabove, it is desirable in this circuit arrangement that crystal 7 operate in the series resonant mode. It is understood in the art that a piezoelectric crystal has an equivalent circuit which may be represented by a series resonant LC circuit and a capacitor in shunt relation with this series circuit. The shunt capacitor represents stray capacity, a portion of which is provided by the crystal holder. In analyzing the equivalent circuit, it has been found that a piezoelectric crystal actually has two frequencies of resonance. One may be termed series resonance for which the impedance is a minimum and the other a parallel resonance for which the impedance is a maximum. At low frequencies the shunt capacitor may be substantially ignored without much error as far as the series mode is concerned and the series mode resonant frequency may be taken as the resonant frequency of the series arm alone. However, as the frequency increases, the tendency is for the shunt capacitor to resonate with the series inductance at a frequency very close to the series resonance. When this shunt resonance occurs close to the natural crystal (series resonant) frequency, interaction effects cause a marked asymmetry in the reactance-vs.-frequency, in the vicinity of series resonance. In particular, the reactance immediately above series resonance increases toward infinity at shunt resonance, rather than toward infinity at infinite frequency, so that the low impedance required for oscillation (unity loop gain) is not obtained at or near shunt resonance. The frequency range over which a crystal will operate in the series resonant mode is relatively narrow due to the presence of the shunt capacity. The frequency difference between series and shunt resonance, and hence the maximum upward excursion of operating frequency, may be approximately doubled if an inductance such as inductance 3*a* is placed in shunt relation with crystal 3. The action of this inductor 3*a* is to anti-resonate the shunt capacitor of the crystal at the series-resonance frequency and therefore extend the upward frequency excursion over which the crystal will operate in the series resonant mode. An additional shunt-resonance also appears symmetrically below series resonance, making the reactance curve more linear. This arrangement thereby provides a more stable frequency signal at the output of the oscillator and provides a greater and more linear range for frequency pull-in in the case of automatic frequency control arrangements or a wider and more linear deviation in case of frequency modulation of the oscillator.

The output from the oscillator may be taken from a tuned circuit including inductance 25 and capacitors 26 located in the anode circuit of electron discharge device 11. The tuned circuit in the anode circuit of electron discharge device 11 may be tuned, as illustrated in the drawing, to twice the crystal frequency, that is, to the second harmonic of the crystal frequency or may be tuned to any convenient harmonic. This tuned circuit has little effect on the frequency of the oscillator because it is very low impedance at the crystal frequency. Therefore, the cathode follower action is preserved for the oscillator circuit.

Referring to FIG. 2, there is illustrated schematically the oscillator circuit of FIG. 1 employing transistor devices rather than electron discharge devices. The circuitry employed in and the operation of the oscillator circuit of FIG. 2 is substantially identical to that described in connection with FIG. 1, like reference characters being employed in FIG. 2 for the components therein which are equivalent to the components of FIG. 1.

The transistor form of oscillator following the principles of this invention includes also a grounded control electrode amplifier 1 and a cathode follower 2 interconnected as illustrated by piezoelectric crystal 3. Amplifier 1 includes a transistor 27, illustrated as a PNP type, having at least an emitter electrode 28 (an electrode for emitting electrical energy carriers), a collector electrode 29 (an electrode for collecting electrical energy carriers) and a base electrode 30 (an electrode to control the flow of electrical energy carriers from the emitting electrode to the collecting electrode). The circuit coupled to collector electrode 29 includes a power supply terminal 31 to which is connected the appropriate negative voltage and tuned circuit 9. Tuned circuit 9 is adjusted as in the case in the circuit of FIG. 1 to be resonant at the crystal frequency. Base electrode 30 is coupled to ground by means of condenser 10 and hence amplifier 1 behaves as a grounded control electrode amplifier with respect to the oscillations in the feedback loop. Cathode follower 2 includes transistor 32 also illustrated to be a PNP transistor having an emitter electrode 33 (an electrical energy carrier emitting electrode), a collector electrode 34 (an electrode to collect the electrical energy carriers) and a base electrode 35 (an electrode to control the flow of electrical energy carriers between the emitting electrode and the collecting electrode). Emitter electrode 33 is biased by means of resistor 15 and base electrode 35 is biased by means of resistor 36 such that current may be drawn by base electrode 35 and hence current limiting will take place to control the amplitude of oscillations.

The feedback circuit for transistor 27 is provided by transistor 32 connected as a cathode follower with respect to the oscillatory energy and crystal 3 coupled between emitter electrode 33 and emitter electrode 28 by means of condensers 17 and 18. Condenser 19 couples signal developed in tuned circuit 9 to base electrode 35 of transistor 32 to complete the feedback circuit.

The resistors 21 and 37 cooperate to bias base electrode 30 with respect to emitter electrode 28 to substantially prevent current limiting in transistor 27. By this biasing arrangement it is possible to inject a control signal from source 22 to change the operating characteristics of transistor 27 and hence bring about the desired frequency change phase shift. To provide the desired biasing of the base electrodes 30 and 35, it has been determined that the value of resistor 37 should be relatively high as compared with the value of resistor 36.

The other components, condensers 17 and 18, resistors 23 and 24 and inductance 3*a*, as incorporated in the circuit of FIG. 2, operate substantially the same as and have substantially the same purpose in the circuit as was described in connection with the circuit of FIG. 1. Tuned circuit 38 connected to collector electrode 34 also serves the same purpose as the tuned circuit including condenser 26 and inductance 25 of the circuit of FIG. 1.

The circuit of FIG. 2 will operate the same and have the same configuration if NPN transistors are substituted for the PNP transistors provided a positive voltage supply is connected to terminal 31 rather than the illustrated negative voltage supply.

While I have described above the principles of my invention in connection with specific apparatus, it is to be clearly understood that this description is made only by way of example and not as a limitation to the scope of my invention as set forth in the objects thereof and in the accompanying claims.

I claim:

1. A frequency controlled oscillator circuit comprising an oscillatory loop including an amplifier circuit having an amplifier device including at least a first electrode emitting electrical energy carriers, a second electrode collecting said electrical energy carriers and a third electrode to control the flow of said electrical energy carriers between said first and second electrodes, a power supply, means to couple one terminal of said power supply to said second electrode, a feedback circuit coupled between said second electrode and said first electrode to sustain oscillations in said oscillatory loop, means to bias said first electrode with respect to said third electrode to substantially prevent current limiting in said amplifier device, said biasing means including means coupled to said one terminal of said power supply, a source of frequency control signals, and means to couple the signal output of said source to said third electrode to control the frequency of said oscillations in accordance with the signals of said source.

2. A frequency controlled oscillator circuit comprising an oscillatory loop including an amplifier circuit having an amplifier device including at least a first electrode emitting electrical energy carriers, a second electrode collecting said electrical energy carriers and a third electrode to control the flow of said electrical energy carriers between said first and second electrodes, a power supply, means to couple one terminal of said power supply to said second electrode, and a feedback circuit coupled between said second electrode and said first electrode including a piezoelectric crystal to sustain oscillations in said oscillatory loop substantially at the frequency of said crystal, means to bias said first electrode with respect to said third electrode to substantially prevent current limiting in said discharge device, said biasing means including means coupled to said one terminal of said power supply, a source of frequency control signals, and means to couple the signal output of said source to said third electrode to control the frequency of said oscillations in accordance with the signals of said source.

3. A frequency controlled oscillator circuit comprising an oscillatory loop including an amplifier circuit having an amplifier device including at least a first electrode emitting electrical energy carriers, a second electrode collecting said electrical energy carriers and a third electrode to control the flow of said electrical energy carriers between said first and second electrodes, a power supply, means to couple one terminal of said power supply to said second electrode, and a feedback circuit coupled between said second electrode and said first electrode including a piezoelectric crystal operating in its series resonant mode to sustain oscillations in said oscillatory loop substantially at the frequency of said crystal, means to bias said first electrode with respect to said third electrode to substantially prevent current limiting in said discharge device, said biasing means including means coupled to said one terminal of said power supply, a source of frequency control signals, and means to couple the signal output of said source to said control grid to control the frequency of said oscillations in accordance with the signals of said source.

4. A frequency controlled oscillator circuit comprising an amplifier device including at least a first electrode emitting electrical energy carriers, a second electrode collecting said electrical energy carriers and a third electrode to control the flow of said electrical energy carriers between said first and second electrodes, a power supply, means to couple one terminal of said power supply to said second electrode, a feedback circuit coupled between the second electrode and first electrode of said amplifier device to sustain oscillations, capactive means only coupling said third electrode to oscillation frequency ground, means to bias the first electrode and the third electrode of said amplifier device to substantially prevent current limiting in said amplifier device, said biasing means including means coupled to said one terminal of said power supply, a source of frequency control signals, and means coupling the signal output of said source to the third electrode of said amplifier device to control the frequency of said oscillations in accordance with the signals of said source.

5. A frequency controlled oscillator circuit comprising an amplifier device including at least a first electrode emitting electrical energy carriers, a second electrode collecting said electrical energy carriers and a third electrode to control the flow of said electrical energy carriers between said first and second electrodes, a power supply, means to couple one terminal of said power supply to said second electrode, a feedback circuit coupled between the second electrode and the first electrode of said amplifier device including a piezoelectric crystal to sustain oscillations at substantially the frequency of said crystal, capacitive means only coupling said third electrode to oscillation frequency ground, means to bias the first electrode and third electrode of said amplifier device to substantially prevent current limiting in said amplifier device, said biasing means including means coupled to said one terminal of said power supply, a source of frequency control signals, and means coupling the signal output of said source to the third electrode of said amplifier device to control the frequency of said oscillations in accordance with the signals of said source.

6. A frequency controlled oscillator circuit comprising an amplifier device including at least a first electrode emitting electrical energy carriers, a second electrode collecting said electrical energy carriers and a third electrode to control the flow of said electrical energy carriers between said first and second electrodes, a power supply, means to couple one terminal of said power supply to said second electrode, a feedback circuit coupled between the second electrode and the first electrode of said amplifier device including a piezoelectric crystal operating in its series resonant mode to sustain oscillations at substantially the frequency of said crystal, capacitive means only coupling said third electrode to oscillation frequency ground, means to bias the first electrode and the third electrode of said amplifier device to substantially prevent current limiting in said amplifier device, said biasing means including means coupled to said one terminal of said power supply, a source of frequency control signals, and means coupling the signal output of said source to the third electrode of said amplifier device to control the frequency of said oscillations in accordance with the signals of said source.

7. A frequency controlled oscillator circuit comprising an oscillator circuit producing signals at a given frequency including a first amplifier device including at least a first electrode emitting electrical energy carriers, a second electrode collecting said electrical energy carriers and a third electrode to control the flow of said electrical energy carriers between said first and second electrodes, a power supply, means coupling the third electrode of said first device to radio frequency ground, means biasing the first electrode of said first device with respect to the third electrode of said first device to substantially prevent current limiting in said first device, said biasing means including means coupled to one terminal of said power supply, a tuned circuit coupled between said one terminal of said power supply and the second electrode of said first device resonant at said given frequency, a second amplifier device including at least a first electrode emitting electrical energy carriers, a second electrode collecting said electrical energy carriers and a third electrode to control the flow of said electrical energy carriers between said first and second electrodes, means coupling the second electrode of said first device to the third electrode of said second device, and means coupling the first electrode of said second device to the first electrode of said first device, a source of frequency control signals, and means coupling the signal output of said source to the third electrode of said first device to control the frequency of the signals of said oscillator circuit in accordance with the signals of said source.

8. A frequency controlled oscillator circuit comprising an oscillator circuit producing signals at a given frequency including a first amplifier device including at least a first electrode emitting electrical energy carriers, a second electrode collecting said electrical energy carriers and a third electrode to control the flow of said electrical energy carriers between said first and second electrodes, a power supply, means coupling the third electrode of said first device to radio frequency ground, means biasing the first electrode of said first device with respect to the third electrode of said first device to substantially prevent current limiting in said first device, said biasing means including means coupled to one terminal of said power supply, a tuned circuit coupled between said one terminal of said power supply and the second electrode of said first device resonant at said given frequency, a second amplifier device including at least a first electrode emitting electrical energy carriers, a second electrode collecting said electrical energy carriers and a third electrode to control the flow of said electrical energy carriers between said first and second electrodes, means coupling the second electrode of said first device to the third electrode of said second device, means coupling the first electrode of said second device to the first electrode of said first device, and means biasing the first electrode of said second device relative to the third electrode of said second device to permit current limiting in said second device, a source of frequency control signals, and means coupling the signal output of said source to the third electrode of said first device to control the frequency of the signals of said oscillator circuit in accordance with the signals of said source.

9. A frequency controlled oscillator circuit comprising an oscillator circuit producing signals at a given frequency including a first amplifier device including at least a first electrode emitting electrical energy carriers, a second electrode collecting said electrical energy carriers and a third electrode to control the flow of said electrical energy carriers between said first and second electrodes, a power supply, means coupling the third electrode of said first device to radio frequency ground, means biasing the first electrode of said first device with respect to the third electrode of said first device to substantially prevent current limiting in said first device, said biasing means including means coupled to one terminal of said power supply, a tuned circuit coupled between said one terminal of said power supply and the second electrode of said first device resonant at said given frequency, a second amplifier device including at least a first electrode emitting electrical energy carriers, a second electrode collecting said electrical energy carriers and a third electrode to control the flow of said electrical energy carriers between said first and second electrodes, means coupling the second electrode of said first device to the third electrode of said second device, a piezoelectric crystal resonant at said given frequency coupled between the first electrode of said second device and the first electrode of said first device, and means biasing the first electrode of said second device relative to the third electrode of said second device to permit current limiting in said second device, a source of frequency control signals, and means coupling the signal output of said source to the third electrode of said first device to control the frequency of the signals of said oscillator circuit in accordance with the signals of said source.

10. A frequency controlled oscillator circuit comprising an oscillator circuit producing signals at a given frequency including a first amplifier device including at least a first electrode emitting electrical energy carriers, a second electrode collecting said electrical energy carriers and a third electrode to control the flow of said electrical energy carriers between said first and second electrodes, a power supply, means coupling the third electrode of said first device to radio frequency ground, means biasing the first electrode of said first device with respect to the third electrode of said first device to substantially prevent current limiting in said first device, said biasing means including means coupled to one terminal of said power supply, a tuned circuit coupled between said one terminal of said power supply and the second electrode of said first device resonant at said given frequency, a second amplifier device including at least a first electrode emitting electrical energy carriers, a second electrode collecting said electrical energy carriers and a third electrode to control the flow of said electrical energy carriers between said first and second electrodes, means coupling the second electrode of said first device to the third electrode of said second device, a piezoelectric crystal coupled between the first electrode of said second device and the first electrode of said first device, a means coupled in shunt relation to said crystal to compensate for the shunt capacity of said crystal and to assure that said crystal resonates in its series resonant mode at said given frequency, and means biasing the first electrode of said second device relative to the third electrode of said second device to permit current limiting in said second device, a source of frequency control signals, and means coupling the signal output of said source to the third electrode of said first device to control the frequency of the signals of said oscillator circuit in accordance with the signals of said source.

11. A frequency controlled oscillator circuit comprising an oscillator circuit producing signals at a given frequency including a first amplifier device including at least a first electrode emitting electrical energy carriers, a second electrode collecting said electrical energy carriers and a third electrode to control the flow of said electrical energy carriers between said first and second electrodes, a power supply, means coupling the third electrode of said first device to radio frequency ground, means biasing the first electrode of said first device with respect to the third electrode of said first device to substantially prevent current limiting in said first device, said biasing means including means coupled to one terminal of said power supply, a tuned circuit coupled between said one terminal of said power supply and the second electrode of said first device resonant at said given frequency, a second amplifier device including at least a first electrode emitting electrical energy carriers, a second electrode collecting said electrical energy carriers and a third electrode to control the flow of said electrical energy carriers between said first and second electrodes, means coupling the second electrode of said first device to the third electrode of said second device, a piezoelectric crystal coupled between the first electrode of said second device and the first electrode of said first device, an inductance coupled in shunt relation to said crystal to assure that said crystal resonates in its series resonant mode at said given frequency and to expand the frequency range at which said crystal will operate in its series resonant mode, and means biasing the first electrode of said second device relative to the third electrode of said second device to permit current limiting in said second device, a source of frequency control signals, and means coupling the signal output of said source to the third electrode of said first device to control the frequency of the signals of said oscillator circuit in accordance with the signals of said source.

12. A frequency controlled oscillator circuit comprising an oscillator circuit for producing signals at a given frequency including a first amplifier device including at least a first electrode emitting electrical energy carriers, a second electrode collecting said electrical energy carriers and a third electrode to control the flow of said electrical energy carriers between said first and second electrodes, means coupling the third electrode of said first device to radio frequency ground, means biasing the first electrode of said first device with respect to the third electrode of said first device including a resistor coupled between the first electrode of said first device and ground to substantially prevent current limiting in said first device, a tuned circuit coupled to the second electrode of said first device resonant at said given frequency, a second amplifier device including at least a first electrode emitting electrical energy carriers, a second electrode collecting said electrical energy carriers and a third electrode to control the flow of said electrical energy carriers between said first and second electrodes, means coupling the second electrode of said first device to the third electrode of said second device, a piezoelectric crystal coupled between the first electrode of said second device and the first electrode of said first device, an inductance coupled in shunt relation to said crystal to assure that said crystal resonates in its series resonant mode at said given frequency and over a relatively wide frequency range, a resistor coupled between each terminal of said crystal and ground to terminate said crystal in a low impedance, and means biasing the first electrode of said second device relative to the third electrode of said second device including a resistor coupled between the first electrode of said second device and ground to permit current limiting in said second device, a source of frequency control signals, means coupling the signal output of said source to the third electrode of said first device to control the frequency of the signals of said oscillator circuit in accordance with the signals of said source, and means coupled to the second electrode of said second device to extract the signals of said oscillator circuit therefrom.

13. A frequency controlled oscillator circuit comprising an oscillator circuit for producing signals at a given frequency including a first amplifier device including at least a first electrode emitting electrical energy carriers, a second electrode collecting said electrical energy carriers and a third electrode to control the flow of said electrical energy carriers between said first and second electrodes, means coupling the third electrode of said first device to radio frequency ground, means biasing the first electrode of said first device with respect to the third electrode of said first device including a resistor coupled between the first electrode of said first device and ground to substantially prevent current limiting in said first device, a tuned circuit coupled to the second electrode of said first device resonant at said given frequency, a second amplifier device including at least a first electrode emitting electrical energy carriers, a second electrode collecting said electrical energy carriers and a third electrode to control the flow of said electrical energy carriers between said first and second electrodes, means coupling the second electrode of said first device to the third electrode of said second device, a piezoelectric crystal coupled between the first electrode of said second device and the first electrode of said first device, an inductance coupled in shunt relation to said crystal to assure that said crystal resonates in its series resonant mode at said given frequency over a relatively wide frequency range, a resistor coupled between each terminal of said crystal and ground to terminate said crystal in a low impedance, and means biasing the first electrode of said second device relative to the third electrode of said second device including a resistor coupled between the first electrode of said second device and ground to permit current limiting in said second device, a source of frequency control signals, means coupling the signal output of said source to the third electrode of said first device to control the frequency of the signals of said oscillator circuit in accordance with the signals of said source, and a tuned circuit resonant at a given harmonic of said given frequency coupled to the second electrode of said second device to extract signals from said oscillator circuit having a frequency equal to said given harmonic.

14. A frequency controlled oscillator circuit comprising an oscillator circuit producing signals at a given frequency including a first electron discharge device having at least a cathode, an anode and a control grid, a power supply, means coupling the control grid of said first device to radio frequency ground, means biasing the cathode of said first device with respect to the control grid of said first device to substantially prevent grid current limiting in said first device, said biasing means including means coupled to the positive terminal of said power supply, a tuned circuit coupled between said positive terminal of said power supply and the anode of said first device resonant at said given frequency, a second electron discharge device having at least a cathode, an anode and a control grid, means coupling the anode of said first device to the control grid of said second device, a piezoelectric crystal coupled between the cathode of said second device and the cathode of said first device, an inductance coupled in shunt relation to said crystal to assure that said crystal resonates in its series resonant mode at said given frequency and to expand the frequency range at which said crystal will operate in its series resonant mode and means biasing the cathode of said second device relative to the control grid of said second device to permit grid current limiting in said second device, a source of frequency control signals, and means coupling the signal output of said source to the control grid of said first device to control the frequency of the signals of said oscillator circuit in accordance with the signals of said source.

15. A frequency controlled oscillator circuit comprising an oscillator circuit producing signals at a given frequency including a first transistor having at least an emitter electrode, a collector electrode, and a base electrode, a power supply, means coupling the base electrode of said first transistor to radio frequency ground, means biasing the emitter electrode of said first transistor with respect to the base electrode of said first transistor to substantially prevent current limiting in said first transistor, said biasing means including means coupled to said negative terminal of said power supply, a tuned circuit coupled between said negative terminal of said power supply and the collector electrode of said first transistor resonant at said given frequency, a second transistor having at least an emitter electrode, a collector electrode, and a base electrode, means coupling the collector electrode of said first transistor to the base electrode of said second transistor, a piezoelectric crystal coupled between the emitter electrode of said second transistor and the emitter electrode of said first transistor, and inductance coupled in shunt relation to said crystal to assure that said crystal resonates in its series resonant mode at said given frequency and to expand the frequency range at which said crystal will operate in its series resonant mode, and means biasing the emitter electrode of said second transistor relative to the base electrode of said second transistor to permit current limiting in said second transistor, a source of frequency control signals, and means coupling the signal output of said source to the base electrode of said first transistor to control the frequency of the signals of said oscillator circuit in accordance with the signals of said source.

16. A frequency controlled oscillator circuit comprising an oscillator circuit for producing signals at a given frequency including a first electron discharge device having at least a cathode, an anode and a control grid, means coupling the control grid of said first device to radio frequency ground, means biasing the cathode of said first device with respect to the control grid of said first device including a resistor coupled between the cathode of said first device and ground to substantially prevent grid current limiting in said first device, a tuned circuit coupled to the anode of said first device resonant at said given frequency, a second electron discharge device having at least a cathode, an anode and a control grid, means coupling the anode of said first device to the control grid of said second device, a piezoelectric crystal coupled between the cathode of said second device and the cathode of said first device, an inductance coupled in shunt relation to said crystal to assure that said crystal resonates in its series resonant mode at said given frequency and over a relatively wide frequency range, a resistor coupled between each terminal of said crystal and ground to terminate said crystal in a low impedance and means biasing the cathode of said second device relative to the control grid of said second device including a resistor coupled between the cathode of said second device and ground to permit grid current limiting in said second device, a source of frequency control signals, means coupling the signal output of said source to the control grid of said first device to control the frequency of the signals of said oscillator circuit in accordance with the signals of said source, and a tuned circuit resonant at a given harmonic of said given frequency coupled to the anode of said second device to extract signals from said oscillator circuit having a frequency equal to said given harmonic.

17. A frequency controlled oscillator circuit comprising an oscillator circuit for producing signals at a given frequency including a first transistor having at least an emitter electrode, a collector electrode, and a base electrode, means coupling the base electrode of said first transistor to radio frequency ground, means biasing the emitter electrode of said first transistor with respect to the base electrode of said first transistor including a resistor coupled between the emitter electrode of said first transistor and ground to substantially prevent current limiting in said first transistor, a tuned circuit coupled to the collector electrode of said first transistor resonant at said given frequency, a second transistor having at least an emitter electrode, a collector electrode, and a base electrode, means coupling the collector electrode of said first transistor to the base electrode of said second transistor, a piezoelectric crystal coupled between the emitter electrode of said second transistor and the emitter electrode of said first transistor, an inductance coupled in shunt relation to said crystal to assure that said crystal resonates in its series resonant mode at said given frequency and over a relatively wide frequency range, a resistor coupled between each terminal of said crystal and ground to terminate said crystal in a low impedance and means biasing the emitter electrode of said second transistor relative to the base electrode of said second transistor including a resistor coupled between the emitter electrode of said second transistor and ground to permit current limiting in said second transistor, a source of frequency control signals, means coupling the signal output of said source to the base electrode of said first transistor to control the frequency of the signals of said oscillator circuit in accordance with the signals of said source, and a tuned circuit resonant at a given harmonic of said given frequency coupled to the collector electrode of said second transistor to extract signals from said oscillator circuit having a frequency equal to said given harmonic.

18. A frequency controlled oscillator circuit comprising an oscillator circuit producing signals at a given frequency including a first amplifier device including at least a first electrode emitting electrical energy carriers, a second electrode collecting said electrical energy carriers and a third electrode to control the flow of said electrical energy carriers between said first and second electrodes, a power supply, means to couple one terminal of said power supply to said second electrode, means coupling the third electrode of said first device to radio frequency ground, means biasing the first electrode of said first device with respect to the third electrode of said first device to substantially prevent current limiting in said first device, said biasing means including means coupled to said one terminal of said power supply, a second amplifier device including at least a first electrode emitting electrical energy carriers, a second electrode collecting said electrical energy carriers and a third electrode to control the flow of said electrical energy carriers between said first and second electrodes, means coupling the second electrode of said first device to the third electrode of said second device, a piezoelectric crystal coupled between the first electrode of said second device and the first electrode of said first device, a means coupled in shunt relation to said crystal to compensate for the shunt capacity of said crystal and to assure that said crystal resonates in its series resonant mode at said given frequency, and means biasing the first electrode of said second device relative to the third electrode of said second device to permit current limiting in said second device, a source of frequency control signals, and means coupling the signal output of said source to the third electrode of said first device to control the frequency of the signals of said oscillator circuit in accordance with the signals of said source.

19. A frequency controlled oscillator circuit comprising an oscillator circuit producing signals at a given frequency including a first amplifier device including at least a first electrode emitting electrical energy carriers, a second electrode collecting said electrical energy carriers and a third electrode to control the flow of said electrical energy carriers between said first and second electrodes, a power supply, means to couple one terminal of said power supply to said second electrode, means coupling the third electrode of said first device to radio frequency ground, means biasing the first electrode of said first device with respect to the third electrode of said first device to substantially prevent current limiting in said first device, said biasing means including means coupled to said one terminal of said power supply, a second amplifier device including at least a first electrode emitting electrical energy carriers, a second electrode collecting said electrical energy carriers and a third electrode to control the flow of said electrical energy carriers between said first and second electrodes, means coupling the second electrode of said first device to the third electrode of said second device, a piezoelectric crystal between the first electrode of said second device and the first electrode of said first device, an inductance coupled in shunt relation to said crystal to assure that said crystal resonates in its series resonant mode at said given frequency and to expand the frequency range at which said crystal will operate in its series resonant mode, means biasing the first electrode of said second device relative to the third electrode of said second device to permit current limiting in said second device, a source of frequency control signals, and means coupling the signal output of said source to the third electrode of said first device to control the frequency of the signals of said oscillator circuit in accordance with signals of said source.

20. A frequency controlled oscillator circuit comprising an oscillatory loop including a grounded grid amplifier, a power supply, means to couple one terminal of said power supply to said amplifier and the other terminal of said power supply to a reference potential, and a feedback circuit in coupled relation to said amplifier to sustain oscillations in said oscillatory loop, a biasing means for said amplifier including means coupled to said one terminal of said power supply to substantially prevent current limiting in said amplifier, and a frequency control element disposed within said oscillatory loop to control the frequency of said oscillations.

21. A frequency controlled oscillator circuit comprising an oscillatory loop including a grounded grid amplifier having an output circuit, a power supply, means to couple one terminal of said power supply to said amplifier and the other terminal of said power supply to a reference potential, and a feedback circuit in coupled relation to said amplifier to sustain oscillations in said oscillatory loop at a given frequency, a biasing means coupled to said amplifier including means coupled to said one terminal of said power supply to prevent current limiting in said amplifier, and a frequency control element disposed within said oscillatory loop to control the frequency of said oscillations, said output circuit including a circuit tuned to said given frequency.

22. A frequency controlled oscillator circuit comprising an oscillatory loop including an amplifier, a power supply, means to couple one terminal of said power supply to said amplifier and the other terminal of said power supply to a reference potential, and a feedback circuit in coupled relation to said amplifier including a piezoelectric crystal to sustain oscillations in said oscillatory loop substantially at the frequency of said crystal, biasing means coupled to said amplifier including means coupled to said one terminal of said power supply to substantially prevent current limiting in said amplifier, and a frequency control element disposed within said oscillatory loop to control the frequency of said oscillations.

23. A frequency controlled oscillator circuit comprising an oscillatory loop including an amplifier having an output circuit, a power supply, means to couple one terminal of said power supply to said amplifier and the other terminal of said power supply to a reference potential, and a feedback circuit in coupled relation to said amplifier including a piezoelectric crystal to sustain oscillations in said oscillatory loop substantially at the frequency of said crystal, biasing means coupled to said amplifier including means coupled to said one terminal of said power supply, and a frequency control element disposed within said oscillatory loop to control the frequency of said oscillations, said output circuit including a circuit tuned to substantially the frequency of said crystal.

24. A frequency controlled oscillator circuit comprising an oscillatory loop including an amplifier, a power supply, means to couple one terminal of said power supply to said amplifier and the other terminal of said power supply to a reference potential, and a feedback circuit in coupled relation to said amplifier including a piezoelectric crystal operating in its series resonant mode to sustain oscillations in said oscillatory loop substantially at the frequency of said crystal, biasing means coupled to said amplifier including means coupled to said one terminal of said power supply to prevent current limiting in said amplifier, and a frequency control element disposed within said oscillatory loop to control the frequency of said oscillations.

25. A frequency controlled oscillator circuit comprising an oscillatory loop including an amplifier having an output circuit, a power supply, means to couple one terminal of said power supply to said amplifier and the other terminal of said power supply to a reference potential, and a feedback circuit in coupled relation to said amplifier including a piezoelectric crystal operating in its series resonant mode to sustain oscillations in said oscillatory loop substantially at the frequency of said crystal, biasing means coupled to said amplifier including means coupled to said one terminal of said power supply, and a frequency control element disposed within said oscillatory loop to control the frequency of said oscillations, said output circuit including a circuit tuned to substantially the frequency of said crystal.

References Cited in the file of this patent

UNITED STATES PATENTS

| | | |
|---|---|---|
| 1,696,626 | Crossley | Dec. 25, 1928 |
| 2,439,890 | Hings | Apr. 20, 1948 |
| 2,530,165 | Hugenholtz et al. | Nov. 14, 1950 |
| 2,546,027 | Downey | Mar. 20, 1951 |
| 2,562,311 | Goldberg | July 31, 1951 |
| 2,598,722 | Richards | June 3, 1952 |
| 2,683,252 | Gordon | July 6, 1954 |
| 2,767,316 | Warner | Oct. 16, 1956 |